(12) United States Patent
Otoma et al.

(10) Patent No.: US 8,023,543 B2
(45) Date of Patent: Sep. 20, 2011

(54) SURFACE EMITTING SEMICONDUCTOR LASER, SURFACE EMITTING SEMICONDUCTOR LASER DEVICE, OPTICAL TRANSMISSION DEVICE, AND OPTICAL INFORMATION PROCESSING DEVICE

(75) Inventors: Hiromi Otoma, Kanagawa (JP); Jun Sakurai, Kanagawa (JP); Ryoji Ishii, Tokyo (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 12/542,806

(22) Filed: Aug. 18, 2009

(65) Prior Publication Data
US 2010/0208764 A1 Aug. 19, 2010

(30) Foreign Application Priority Data
Feb. 18, 2009 (JP) .................................. 2009-035078

(51) Int. Cl.
H01S 5/042 (2006.01)
H01S 5/183 (2006.01)
(52) U.S. Cl. ............. 372/38.05; 372/46.01; 372/46.013; 372/50.11; 372/50.124; 372/87
(58) Field of Classification Search ............... 372/38.05, 372/46.01, 46.013, 50.124, 87, 50.11
See application file for complete search history.

(56) References Cited

U.S. PATENT DOCUMENTS

| 7,406,112 B2 * | 7/2008 | Kondo ................... 372/50.23 |
| 2004/0008747 A1 * | 1/2004 | Nakayama et al. ........... 372/46 |
| 2005/0083981 A1 * | 4/2005 | Kaneko et al. ................. 372/50 |
| 2006/0245459 A1 * | 11/2006 | Onishi et al. ............... 372/46.01 |
| 2007/0147459 A1 * | 6/2007 | Ueki ...................... 372/50.124 |

FOREIGN PATENT DOCUMENTS

| JP | 10-242560 | 9/1998 |
| JP | 11-68225 | 3/1999 |

OTHER PUBLICATIONS

Ieice Trans. Electron., vol. E85-C, No. 4, Apr. 2002, pp. 995-1000.

* cited by examiner

Primary Examiner — Jessica Stultz
Assistant Examiner — Michael Carter
(74) Attorney, Agent, or Firm — Fildes & Outland, P.C.

(57) ABSTRACT

A surface emitting semiconductor laser includes: a semiconductor substrate; a lower reflector that is formed on the semiconductor substrate and includes a semiconductor multilayer of a first conduction type; an upper reflector that is formed above the semiconductor substrate and includes a semiconductor multilayer of a second conduction type; an active region interposed between the lower reflector and the upper reflector; a current confining layer that is interposed between the lower reflector and the upper reflector and has a conductive region having an anisotropic shape in a plane perpendicular to an optical axis; and an electrode that is formed on the upper reflector and has an opening via which a laser beam is emitted, the opening having different edge shapes in directions of the anisotropic shape.

8 Claims, 11 Drawing Sheets

B-B LINE CROSS SECTION     A-A LINE CROSS SECTION

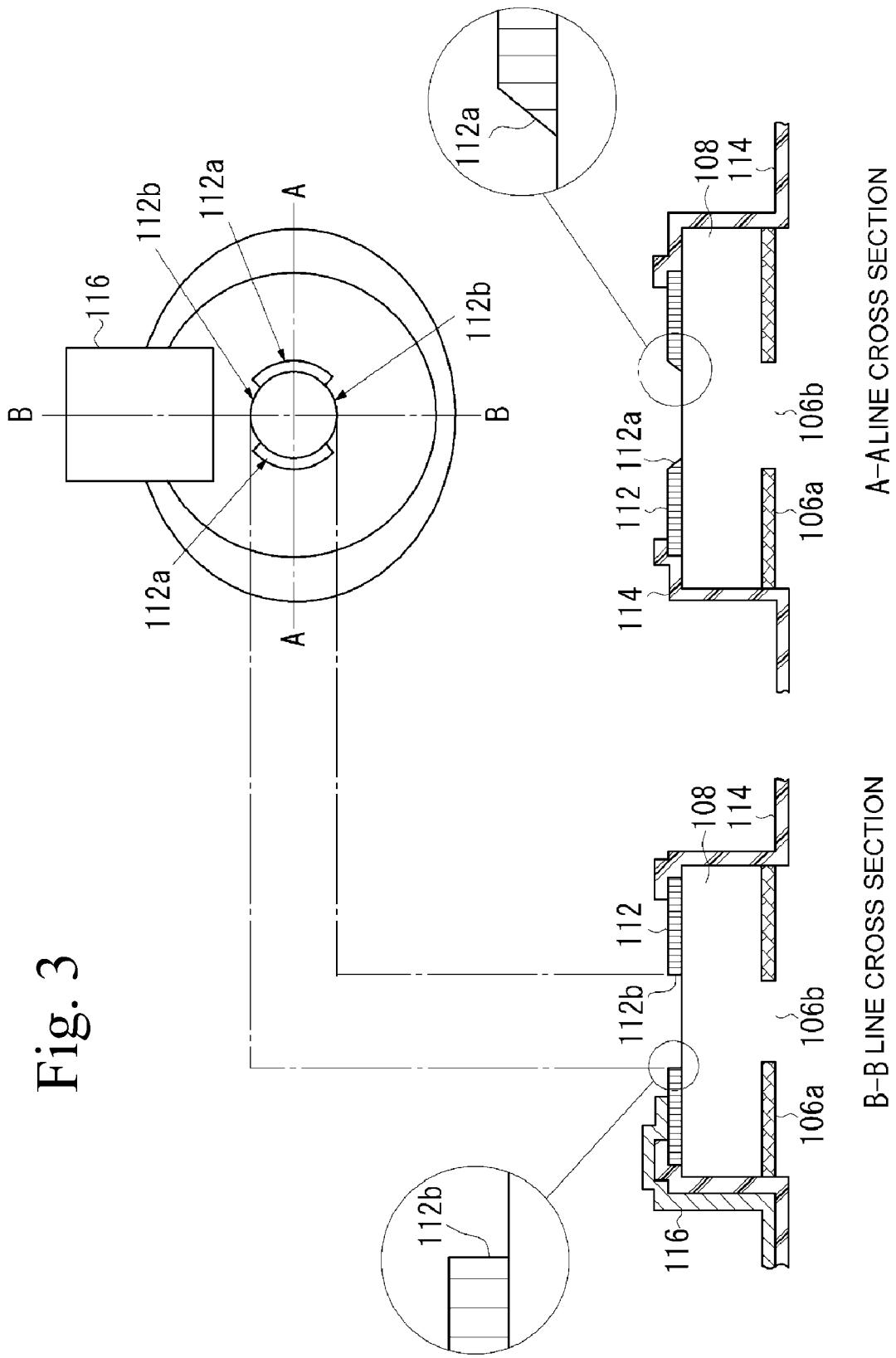

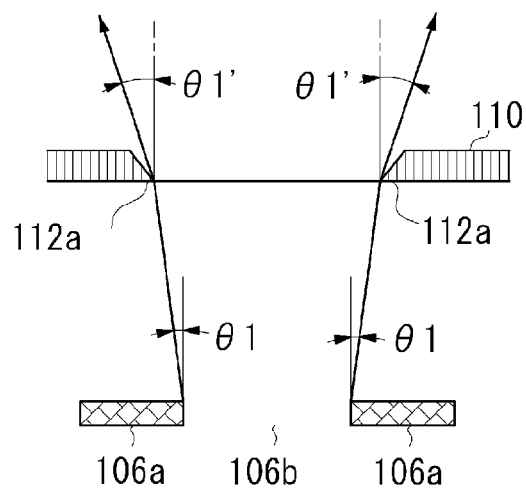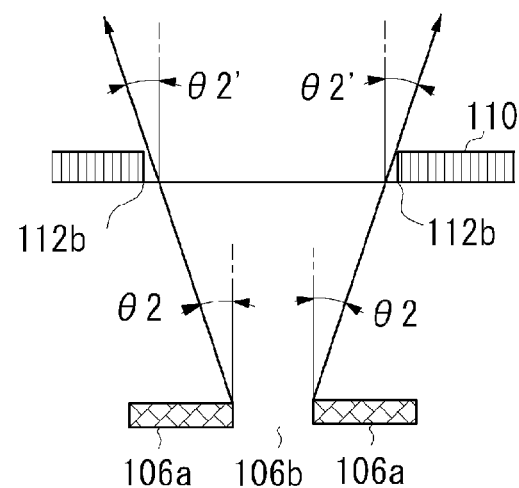
Fig. 4A
Fig. 4B

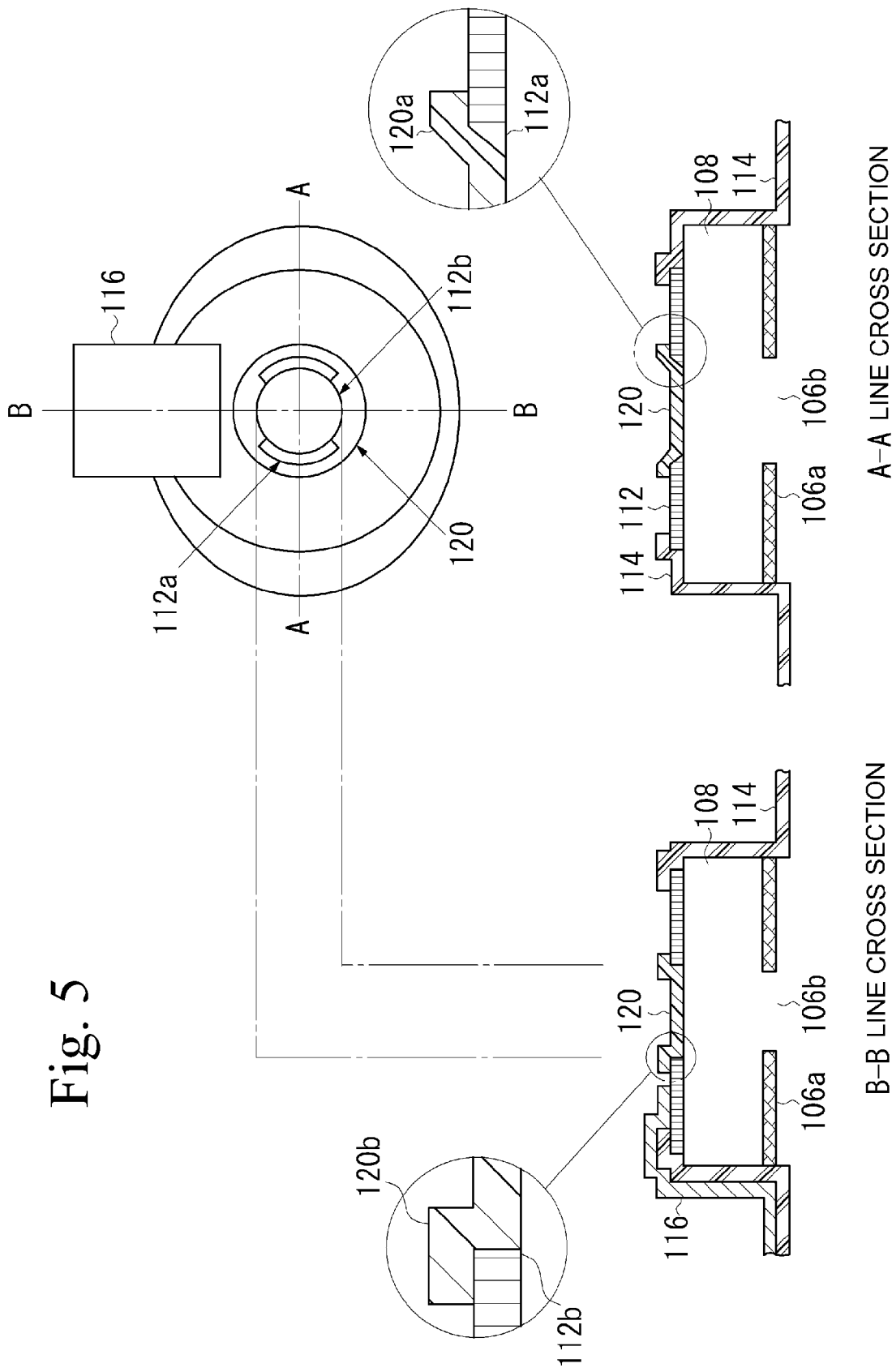

B-B LINE CROSS SECTION

SURFACE EMITTING SEMICONDUCTOR LASER, SURFACE EMITTING SEMICONDUCTOR LASER DEVICE, OPTICAL TRANSMISSION DEVICE, AND OPTICAL INFORMATION PROCESSING DEVICE

CROSS-REFERENCE TO RELATED APPLICATION

This application is based on and claims priority under 35 USC 119 from Japanese Patent Application No. 2009-035078 filed Feb. 18, 2009.

BACKGROUND

1. Technical Field

The present invention relates to a surface emitting semiconductor laser, a surface emitting semiconductor laser device, an optical transmission device, and an optical information processing device.

2. Related Art

A vertical cavity surface emitting laser (VCSEL) is utilized as a light source of a communication device and an image forming apparatus. A typical VCSEL of selective oxidization type has a vertical resonator structure in which a current confining layer having an oxidized aperture defined by selective oxidization is formed. The oxidized aperture confines current applied via an electrode and injects current thus confined in an active region. Further, the oxidized aperture confines light generated in the active region in the center of emission due to the difference between the inside of the oxidized aperture and the outside thereof. Furthermore, the oxidized aperture is formed in an elliptic shape in a substance plane vertical to the optical axis, so that the polarized plane of laser can be controlled to the direction of the longitudinal axis of the oxidized aperture.

SUMMARY

According to an aspect of the invention, there is provided a surface emitting semiconductor laser includes: a semiconductor substrate; a lower reflector that is formed on the semiconductor substrate and includes a semiconductor multilayer of a first conduction type; an upper reflector that is formed above the semiconductor substrate and includes a semiconductor multilayer of a second conduction type; an active region interposed between the lower reflector and the upper reflector; a current confining layer that is interposed between the lower reflector and the upper reflector and has a conductive region having an anisotropic shape in a plane perpendicular to an optical axis; and an electrode that is formed on the upper reflector and has an opening via which a laser beam is emitted, the opening having different edge shapes in directions of the anisotropic shape.

BRIEF DESCRIPTION OF THE DRAWINGS

FIG. 3 illustrates a VCSEL in accordance with a first embodiment;

FIGS. 4A and 4B describe an enlargement of a beam divergence angle in the VCSEL in accordance with the first embodiment;

FIG. 5 illustrates a VCSEL in accordance with a second embodiment;

DETAILED DESCRIPTION

A description will now be given of exemplary embodiments of the invention with reference to the accompanying drawings. An exemplary embodiment described below is a VCSEL of single-spot type. However, the present invention is not limited to the single-spot type but includes a VCSEL of multi-spot type. The scale of the drawings is emphasized for facilitating better understanding of embodiments, and may be different from that of actual devices.

Figure 1:
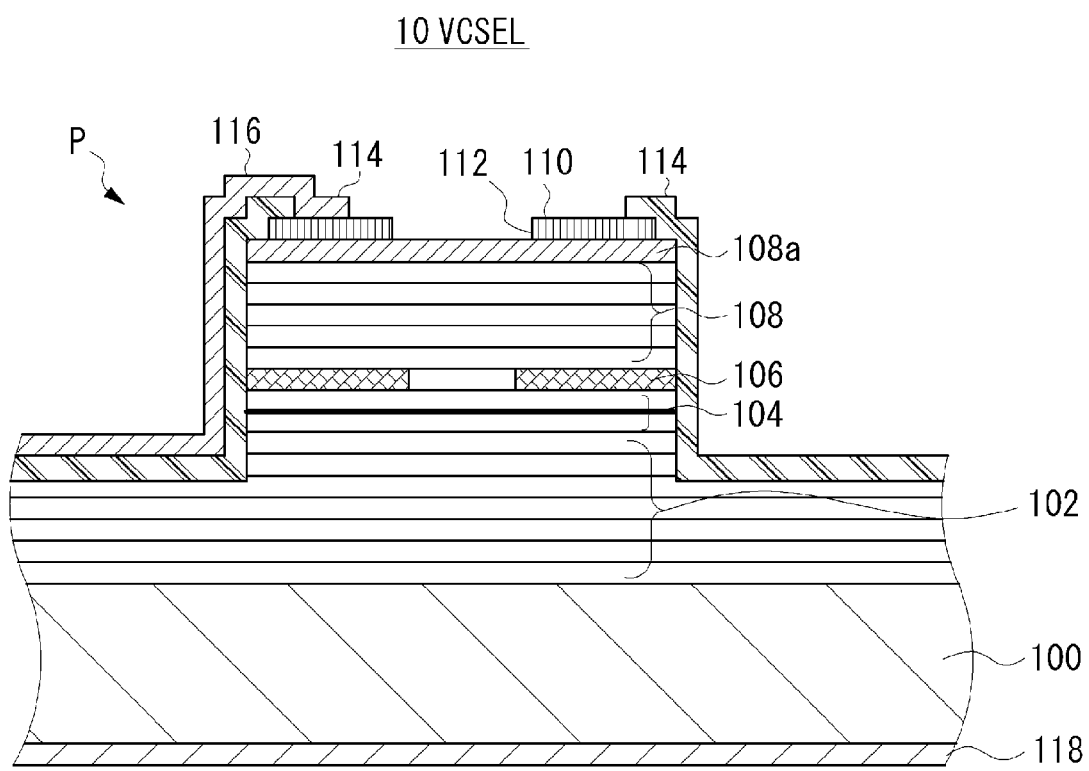
FIG. 1 is a cross-sectional view of a VCSEL in accordance with an embodiment.

FIG. 1 is a cross-sectional view of a VCSEL in accordance with an exemplary embodiment. A VCSEL 10 has an n-type GaAs substrate 100, on which there are stacked a lower DBR (Distributed Bragg Reflector) 102 of n type, an active region 104, a current confining layer 106, an upper DBR 108 of p type. The lower DBR 102 and the upper DBR 108 form a vertical resonator on the GaAs substrate 100. The lower DBR 102 is composed of two different AlGaAs layers of different Al compositions that are alternately stacked. The current confining layer 106 has an anisotropic shape and is made of a p-type AlAs in which an oxidized region is formed in the periphery. The upper DBR is composed of two different AlGaAs layers of different Al compositions that are alternately stacked.

A post P formed in an elliptic shape is formed so as to extend from the upper DBR 108 to a part of the lower DBR 102. The post P may be formed into a desired shape by etching the semiconductor layers stacked on the substrate by a known photolithographic process. The post P has an anisotropic shape, more particularly, an elliptic shape having a major axis and a minor axis when being viewed horizontally in a direction parallel to the main surface of the semiconductor substrate. The major axis of the post P is formed so as to be parallel to a crystal axis <011> or <01-1> of the GaAs substrate 100.

A p-side electrode 110 of a ring shape is formed on the top of the post P, and an opening 112 is formed at the center of the p-side electrode 110. The opening 112 may be shaped in an ellipse. The opening 112 is not limited to the ellipse but may be shaped in a circle. The opening 112 is an emission window via which the laser beam is emitted, and the center of the opening 112 is aligned with the optical axis. Preferably, a p-type GaAs contact layer 108a having a high impurity concentration forms the uppermost layer of the upper DBR 108, and the p-side electrode 110 is in ohmic contact with the GaAs contact layer 108a.

An interlayer insulating film 114, which may be made of SiNx is formed so as to cover the bottom, side and a part of the top of the post P. A metal interconnection layer 116 extends along the interlayer insulating film 114 and contacts the p-side electrode 110. The metal interconnection layer 116 extends up to a pad forming region not illustrated, and is connected to a bonding pad in the pad forming region. An n-side electrode 118 is formed on the backside of the GaAs substrate 100.

Figure 2:
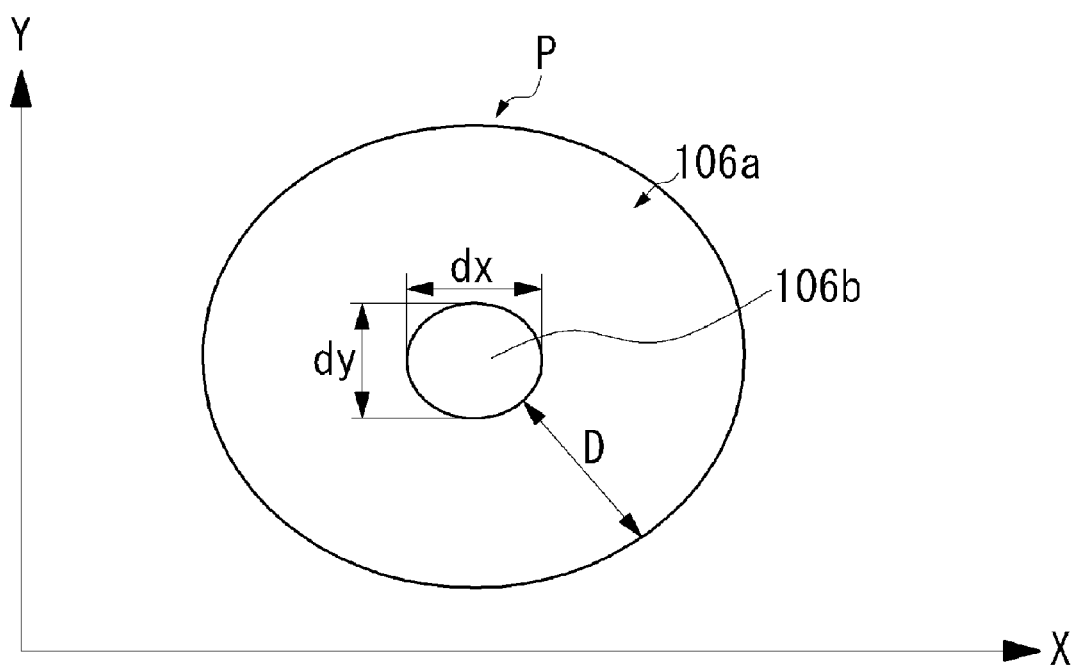
FIG. 2 illustrates a relation between a post and an oxidized aperture.

FIG. 2 horizontally illustrates the relation between the post P and the oxidized aperture. As illustrated in FIG. 2, it is assumed that the major axis of the post P formed in the elliptic shape on the horizontal plane coincides with the X axis, and the minor axis thereof coincides with the Y axis. After the post P is formed, a part of the current confining layer 106 is oxidized. The current confining layer 106 is made of AlGaAs having a higher Al composition ratio than that of AlAs or DBR, and the oxidizing rate is greater than that of the lower DBR 102 and that of the upper DBR 108. By oxidizing the current confining layer 106 for a predetermined period of time, the current confining layer 106 is uniformly oxidized from the periphery by an oxidized distance D, so that an oxidized region 106a can be defined. An oxidized aperture (electrically conductive region) 106b surrounded by the oxidized region 106a is thus formed, and is formed into an elliptic shape having a major axis dm and a minor axis dm that reflect the outer shape of the post P. The center of the oxidized aperture 106b coincides with the optical axis or the center of the opening 112. The diameter of the oxidized aperture 106b is selected so that only the laser beam of the single mode (fundamental transverse mode) can be emitted. The current confining layer 106 thus formed makes it possible to emit the laser beam having a polarized plane in the major direction (X direction) of the oxidized aperture 106b via the opening 112.

A VCSEL in accordance with a first embodiment will now be described. FIG. 3 is a schematic plan view illustrating a shape relation of the opening in the p-side electrode and the oxidized aperture in accordance with the first embodiment. In FIG. 3, the major-axis direction of the post P is a direction in which a line A-A extends, and the minor-axis direction thereof is a direction in which a line B-B extends. The oxidized aperture is oriented in the same directions as those of the post P. The p-side electrode 110 has a ring shape, and a part thereof is connected to the metal interconnection layer 116. The shape of the p-side electrode 110 exposed to the opening 112 is not uniform but is different in terms of the orientation of the crystal axis of the GaAs substrate, in other words, the orientation of the oxidized aperture. As illustrated in the cross-sectional view taken along the line A-A, the shapes of two edges 112a of the opening 112 opposite to each other in the major-axis direction are tapered and are inclined with respect to the optical axis. Preferably, the shapes of the opposite edges 112a are tapered within a range in which the inner angle about the optical axis is 90 degrees. In contrast, as illustrated in the cross-sectional view taken along the line B-B, the shapes of two edges 112b of the opening opposite to each other in the minor-axis direction are formed s as to stand vertically. Preferably, the shapes of the opposite edges 112b stand vertically within a range in which the inner angle about the optical axis is 90 degrees. Thus, the shape of the edge of the opening 112 is formed so that the tapered edge 112a and the vertical edge 112b are alternately arranged at intervals of 90 degrees.

The beam divergence angle of the laser may be defined by the shape of the oxidized aperture 106b. That is, the beam divergence angle of the laser passing through the oxidized aperture 106b in the major-axis direction is smaller than that in the minor-axis direction. Thus, the profile of the laser beam is not circular but is deformed. In a case where the laser beam is required to have a higher resolution, the beam profile is preferably circular. In the present embodiment, the beam divergence angle of the laser is controlled so that the beam divergence angle on the major-axis side is increased or the divergence angle on the minor-axis side is decreased while the polarized plane of the laser beam is controlled.

The laser beam emitted from the opening 112 of the p-side electrode 110 is diffracted by the edge shapes 112a and 112b of the opening 112. The diffraction angles depend on the edge shapes 112a and 112b. The diffraction angle for the tapered edge shapes 112a is greater than that for the vertical edge shapes 112b. By arranging the tapered edge shapes 112a in the major-axis direction, the beam divergence angle on the major-axis sides of the oxidized aperture 106b can be increased due to diffraction. The edge shapes 112b are arranged on the minor-axis sides of the oxidized aperture 106b, the beam divergence angles on the minor-axis sides are little changed. It is thus possible to control the beam divergence angles in the respective directions by utilizing the diffraction that may take place at the edges of the opening 112.

FIGS. 4A and 4B illustrate the beam divergence angle and diffraction of the laser beam. As illustrated in FIG. 4A, the beam divergence angle in the major-axis direction of the oxidized aperture 106b is θ1, and the beam divergence angle in the minor-axis direction is θ2. The beam divergence angles θ1 and θ2 have a relation such that θ1<θ2. The laser beam on the major-axis sides is diffracted by the tapered edge shapes 112a of the opening 112, and the beam divergence angle of the laser emitted from the opening 112 is expanded to θ1' (θ1'>θ1). The laser beam on the minor-axis sides is diffracted by the vertical edge shapes 112b of the opening 112, and the beam divergence angle of the laser emitted from the opening 112 is expanded to θ2' (θ2'>θ2). In this case, the above beam divergence angles meet a relation such that (θ1'−θ1)>(θ2'−θ2). The laser beam on the minor-axis sides is not necessarily diffracted by the edge shapes 112b and the angles θ2' and θ2 are equal to each other (θ2'−θ2=0). In a case where the laser beam is not wanted to be diffracted on the minor-axis sides, the size of the opening 112 in the minor-axis direction is enlarged so as to prevent the laser beam from being incident to the edge shapes 112b.

The opening 112 used in the above embodiment is not limited to the elliptic shape but may be formed in a circular shape. It is sufficient to diffract the laser beam only by the edge shapes 112a on the major-axis sides required to have an increased beam divergence angle, and it is not necessary to diffract the laser beam by the edge shapes 112b on the minor-axis sides. Thus, the distance between the two opposite edge shapes 112a may be smaller than the length of the major axis of the oxidized aperture 106b or may be equal or slightly greater than the length of the major axis of the oxidized aperture 106b. The edge shapes 112b on the minor-axis sides are not limited to the vertical shape but may be a shaper having a greater taper angle than that of the edge shapes 112a and causing a relatively small diffraction angle.

A second embodiment of the present invention will now be described. FIG. 5 illustrates a structure of a VCSEL in accordance with a second embodiment. The VCSEL of the second embodiment is configured to employ a protection film 120 in addition to the VCSEL of the first embodiment. The protection film 120 is a transparent insulator film such as SiON through which the laser beam passes. The protection film 120 covers the opening 112, more particularly, the edge shapes of the opening 112. The protection film 120 may have an even thickness. Even when the protection film 120 may have an even thickness, the underlying edge shapes 112a and 112b are different from each other on the direction base. Thus, the protection film 120 has anisotropic portions 120a and 120b that depend on the edge shapes 112a and 112b. Thus, the difference in the refractive index on the direction base is added to the diffraction effect, and the beam divergence angle may be further changed.

Figure 6:
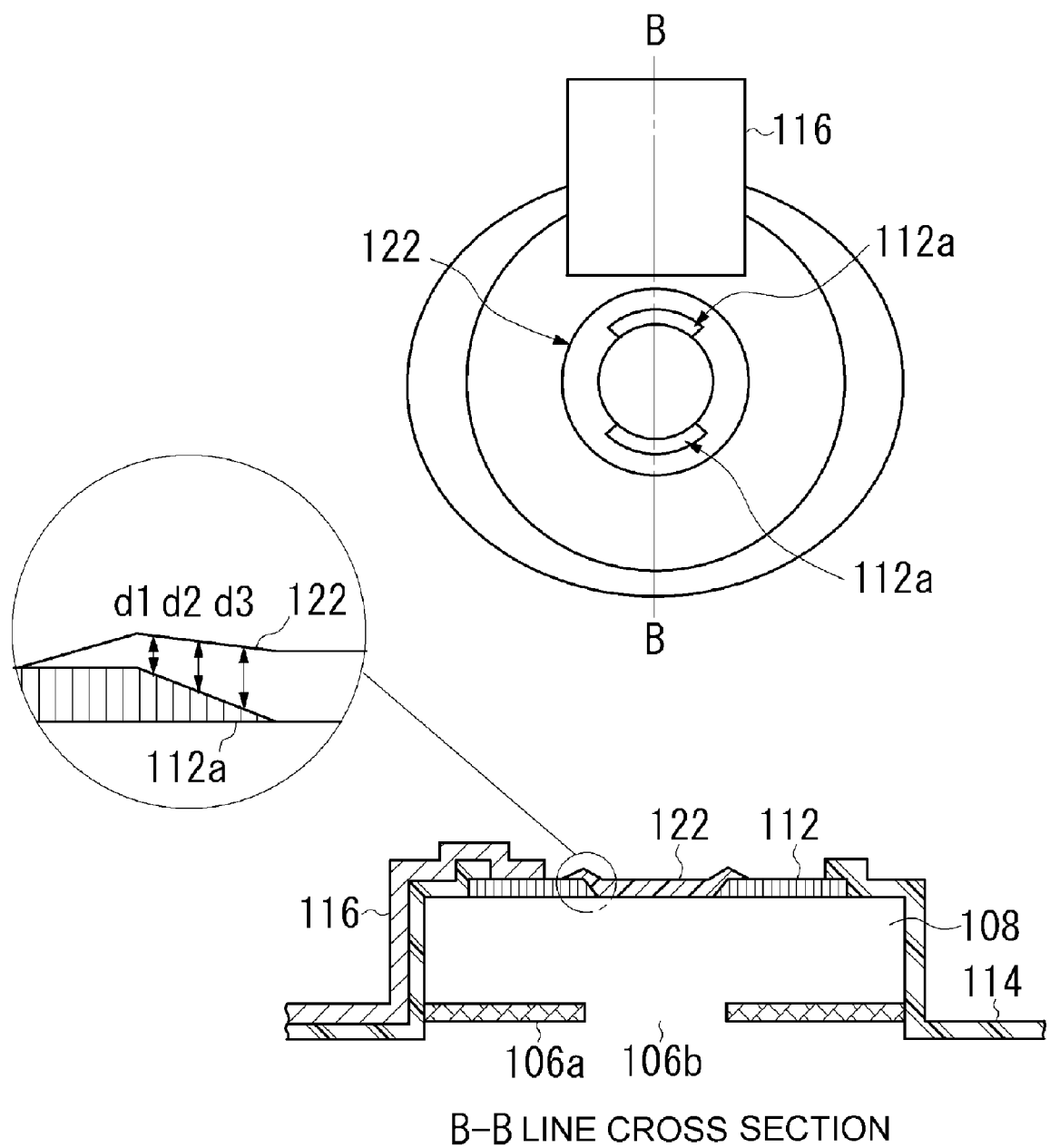
FIG. 6 illustrates a VCSEL in accordance with a third embodiment.

A third embodiment of the present invention will now be described. FIG. 6 illustrates a structure of a VCSEL in accordance with a third embodiment. The VCSEL of the third embodiment varies the thickness of the protection film employed in the second embodiment. In the third embodiment, the edge shapes 112a of the oxidized aperture in the minor-axis sides are tapered, and the edge shapes 112b on the long-axis sides are vertical. The opening 112 is covered with a protection film 122. The thickness of the protection film 122 is approximately uniform in the center portion and is gradually decreased towards the periphery. That is, as illustrated in an enlarge portion in FIG. 6, the protection film 122 on the edge shapes 112a changes so that d3>d2>d1. Thus, the diffracted laser beam is refracted in accordance with the change of the optical path length of the film thicknesses d1, d2 and d3.

In the example shown in FIG. 6, the laser beam diffracted by the edge shapes 112a is refracted by the protection film 122 so that the beam divergence angle reduces (towards the optical axis). Thus, the edge shapes 112a are arranged on the minor-axis sides of the oxidized aperture, and are adjusted so that the beam divergence angle enlarged by diffraction is reduced by the protection film 122. In contrast to FIG. 6, the thickness of the protection film 122 that covers the edge shapes 112a gradually increases, and the diffracted light is refracted at an increased beam divergence angle. In this case, as in the case of the second embodiment, the edge shapes 112a are arranged on the major-axis sides of the oxidized aperture, the beam divergence angle on the major-axis sides can be enlarged by refraction.

According to the present embodiment, the polarization and the beam divergence angle can be controlled separately. It is thus possible to manufacture VCSELs required to have strict specifications in terms of both the polarization and the beam divergence angle for use in laser beam printing machines and expect high yield. For example, in a case where the oxidized aperture is shaped into a distorted shape such as an ellipse in order to obtain laser having the stabilized polarization, there is a difference in the beam divergence angle between the different directions. When the present embodiment is applied to the above case, it is possible to enlarge the diffraction angle only in the direction of the small beam divergence angle and to obtain polarization-stabilized laser having no difference in the beam divergence angle between the different directions.

Figure 7A:
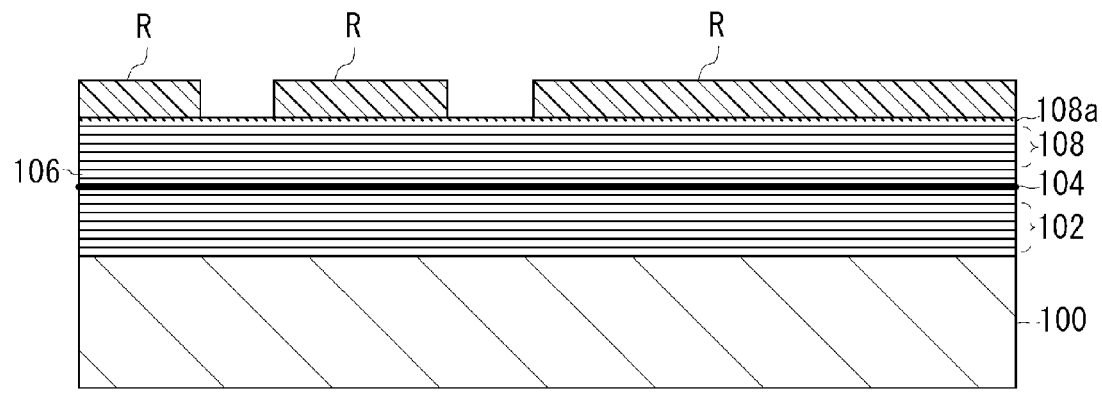
FIGS. 7A through 7C are cross-sectional views for illustrating a method for manufacturing the VCSEL in accordance with the second embodiment.

A description will now be given, with reference to FIGS. 7A through 7C and FIGS. 8A and 8B, of a method for manufacturing the VCSEL in accordance with the second embodiment. Referring to FIG. 7A, the n-type lower DBR 102 is formed on the n-type GaAs substrate 100 by MOCVD. The n-type lower DBR 102 is formed by alternately stacking an $Al_{0.9}Ga_{0.1}As$ layer of a carrier concentration of $2\times10^{18}$ cm$^{-3}$ and an $Al_{0.12}Ga_{0.88}As$ layer of a carrier concentration of $2\times10^{18}$ cm$^{-3}$ for 40.5 periods so that each layer has a thickness equal to ¼ of the in-medium wavelength. The active region 104 having a thickness equal to the in-medium wavelength is formed on the n-type lower DBR 102. The active region 104 is composed of an undoped $Al_{0.6}Ga_{0.4}As$ lower spacer layer, an undoped quantum well active layer, and an undoped $Al_{0.6}Ga_{0.4}As$ upper spacer layer. The undoped quantum well active layer is composed of three GaAs quantum well layers having a thickness of 70 nm and four $Al_{0.3}Ga_{0.7}As$ barrier layers having a thickness of 50 nm. The p-type current confining layer 106 made of p-type AlAs is formed on the active region 104. The p-type upper DBR 108 is formed by alternately stacking an $Al_{0.9}Ga_{0.1}As$ layer of a carrier concentration of $2\times10^{18}$ cm$^{-3}$ and an $Al_{0.12}Ga_{0.88}As$ layer of a carrier concentration of $2\times10^{18}$ cm$^{-3}$ for 30 periods so that each layer has a thickness equal to ¼ of the in-medium wavelength. The uppermost layer of the p-type upper DBR 108 is the p-type GaAs contact layer 108a having a carrier concentration of $1\times10^{19}$ cm$^{-3}$. An n-type buffer layer may be interposed between the GaAs substrate 100 and the lower DBR 102. The Al composition may be gradually changed in order to reduce the electrical resistance of DBR.

Figure 7B:
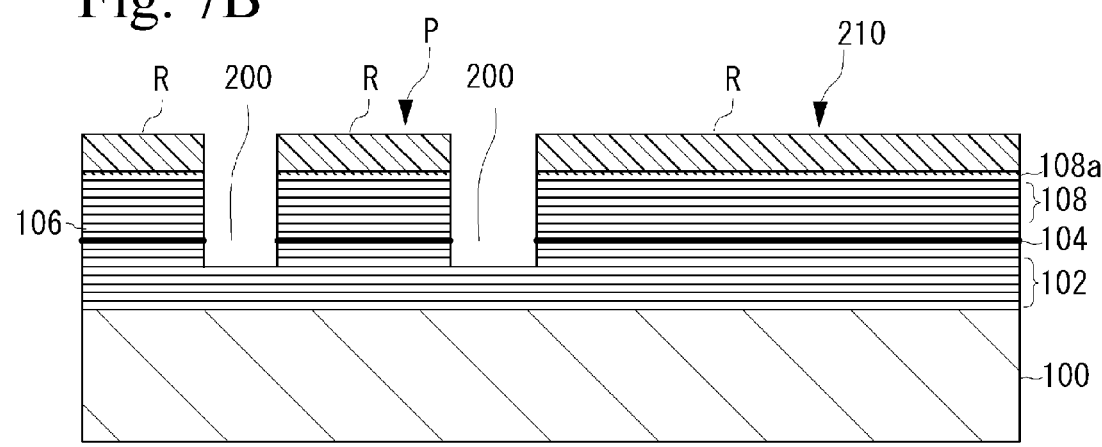

A resist mask R is formed on the crystal growth layer by the photolithographic process. Then, the crystal growth layer is etched up to a part of the lower DBR 102 by reactive ion etching with an etching gas of boron trichloride, so that an elliptic groove 200 is formed as illustrated in FIG. 7B. Thus, the post P having an elliptic shape and a pad formation area 210 are formed on the substrate.

Figure 7C:
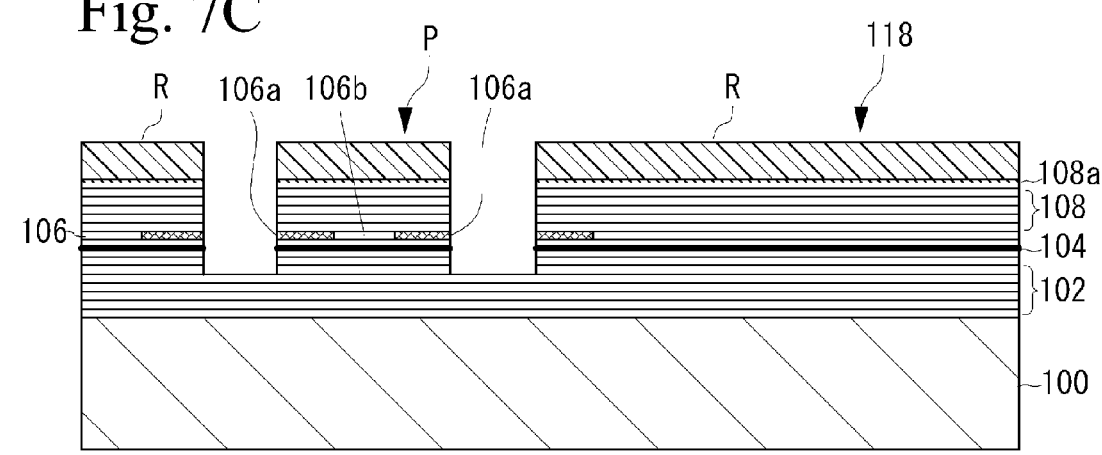

As illustrated in FIG. 7C, the substrate is exposed to an atmosphere of moisture vapor at 340° C. for oxidization. Thus, the oxidized region 106a and the oxidized aperture 106b are formed in the current confining layer 106.

Figure 8A:
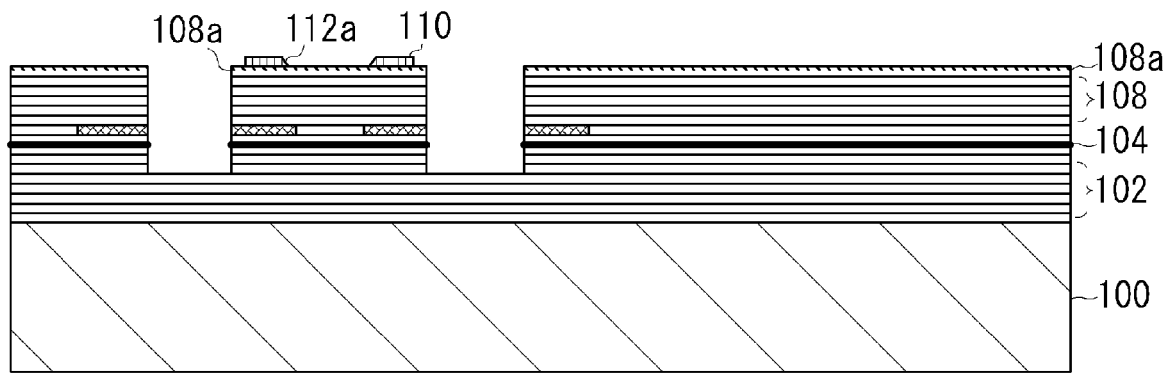
FIGS. 8A and 8B are cross-sectional views for illustrating subsequent steps of the method for manufacturing the VCSEL in accordance with the second embodiment.
Figure 8B:
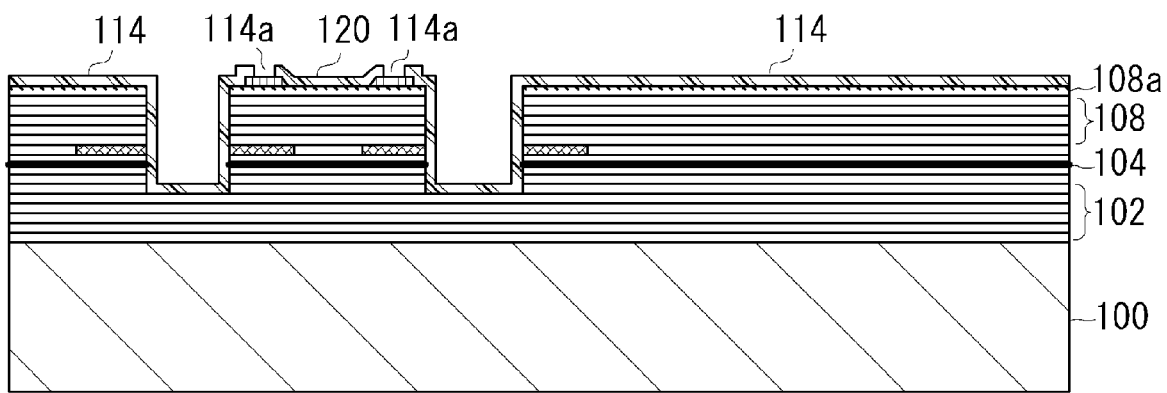

The resist R is removed. Then, as illustrated in FIG. 8A, the p-side electrode 110 of a ring shape is formed on the top of the post P by a machine for EB deposition. The p-side electrode 110 may be made of, for example, Au. The p-side electrode 110 has a given thickness that makes it possible to block light. The edge shapes of the opening 112 in the p-side electrode 110 may be changed by etching or evaporation. For example, in a case where the p-side electrode is formed by liftoff, a resist pattern is formed on the contact layer 108a, and gold is evaporated in the direction vertical to the substrate. It is thus possible to form the vertical edge shapes 112b of the opening 112. A mask that covers the edge shapes 112b is formed and gold is evaporated obliquely to the substrate that is rotating. It is thus possible to form the tapered edge shapes 112a of the opening 112. Alternatively, the p-side electrode is evaporated and the opening 112 is dry etched by utilizing the etching mask. Thus, the edge shape is evenly formed in all the periphery of the opening 112. Then, an etching mask is formed so that regions in which tapered edge shapes should be formed are exposed. The exposed regions are wet etched so that the tapered edge shapes 112a can be formed. The direction of the opening 112 is the same as that of the oxidized aperture 106b. That is, the major-axis directions of the opening 112 and the oxidized aperture 106b are the same as each other, and the minor-axis directions thereof are the same as each other.

The interlayer insulating film 114 made of SiON is evaporated on the entire surface of the substrate including the groove 200 by plasma CVD. Then, the interlayer insulating film 114 is etched so as to form an contact hole 114a exposing a part of the p-side electrode 110. The opening 112 in the p-side electrode 110 is completely covered with the interlayer insulating film 114, and the protection film 120 in the second embodiment (FIG. 5) is simultaneously formed. In a case where the protection film 120 is formed so as to be different from the interlayer insulating film 114 in thickness and material, the protection film 120 may be formed separately by another process. The metal interconnection layer 116 is formed and is connected to the p-side electrode 110 via the contact hole. The n-side electrode of Au/Ge is evaporated to the backside of the substrate.

Figure 9A:
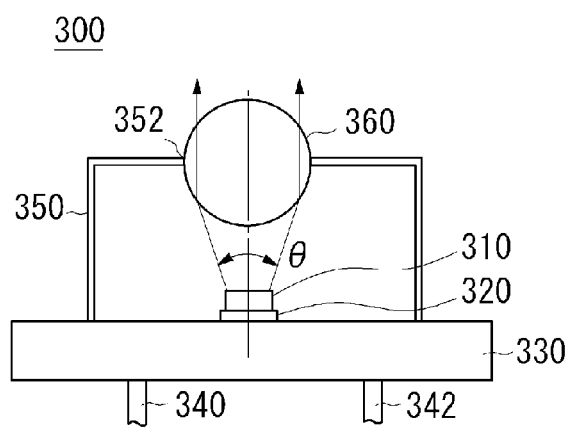
FIGS. 9A and 9B are cross-sectional views of surface emitting semiconductor laser devices equipped with the VCSEL in accordance with any of the embodiments.

A description will now be given of a surface emitting laser device, an optical information processing device, and an optical transmission device configured by using the VCSEL of the embodiments. FIG. 9A is a cross-sectional view a surface emitting laser device in which the VCSEL and an optical component is packaged. A surface emitting semiconductor laser device 300 is has a chip 310 on which the VCSEL is formed is fixed to a disk-shaped metal stem 330 by an electrically conductive adhesive 320. Electrically conductive leads 340 and 342 are inserted into through holes (not illustrated) formed in the stem 330. The lead 340 is electrically connected to the n-side electrode of the VCSEL, and the other lead 342 is electrically connected to the p-side electrode.

A rectangular hollow cap 350 is fixed on the stem 330 including the chip 310, and a ball lens 360 is fixed in a window 352 provided at the center of the cap 350. The optical axis of the ball lens 360 is positioned so as to coincide with the center of the chip 310. When a forward voltage is applied between the leads 340 and 342, the laser beam is emitted vertically from the chip 310. The distance between the chip 310 and the ball lens 360 is adjusted so that the ball lens 360 is included within the beam divergence angle θ of the laser beam emitted from the chip 310. A light receiving element and a temperature sensor may be arranged in the cap 350 in order to monitor the emitting condition of the VCSEL.

Figure 9B:
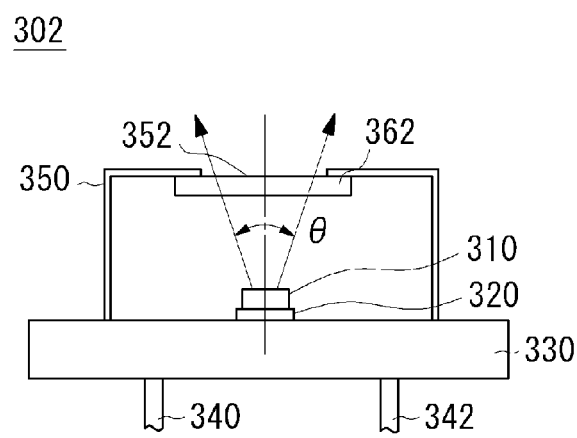

FIG. 9B illustrates another configuration of the surface emitting semiconductor laser device 302, which uses a flat glass plate 362 instead of the ball lens 360 so as to cover the window 352. The center of the flat glass plate 362 is positioned so as to coincide with the center of the chip 310. The distance between the chip 310 and the flat glass plate 362 is adjusted so that the ball lens 360 is included within the beam divergence angle θ of the laser beam emitted from the chip 310.

Figure 10:
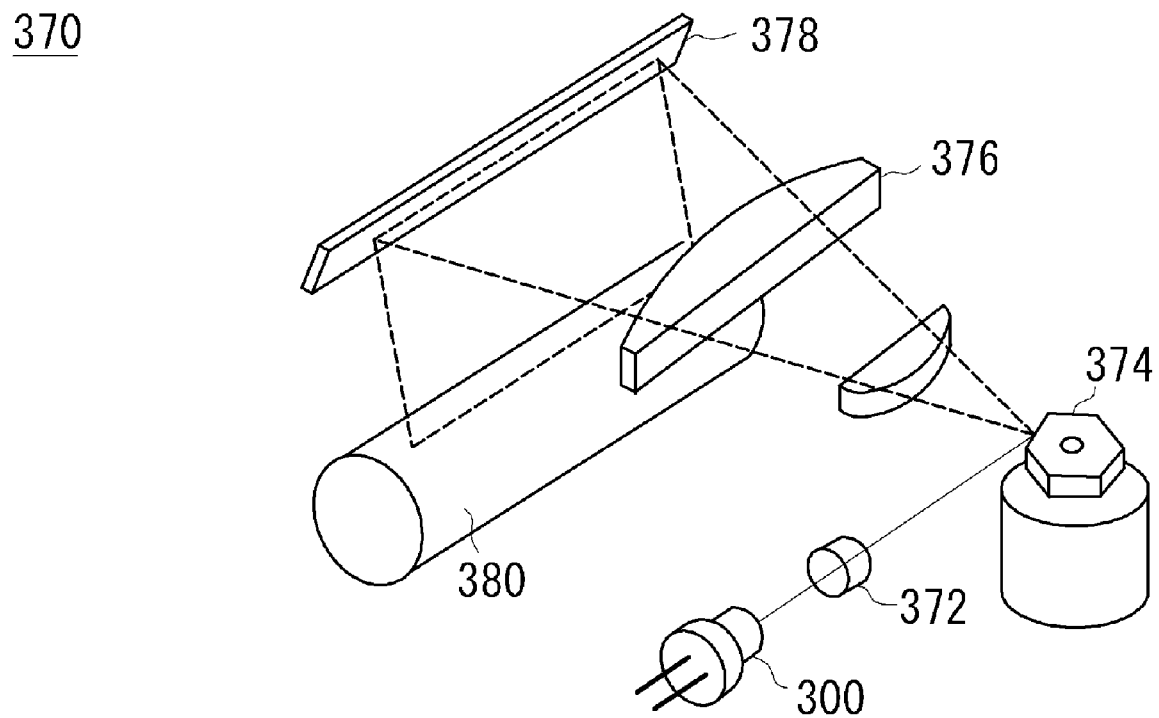
FIG. 10 illustrates a light source using the VCSEL in accordance with any of the embodiments.

FIG. 10 illustrates an example in which the VCSEL is used as a light source of an optical information processing device. An optical information processing device 370 includes the semiconductor laser device 300 or 302, a collimator lens 372, a polygon mirror 374, an fθ lens 376, a line-shaped reflection mirror 378, and a photosensitive drum (recording medium) 380. The laser beam from the semiconductor laser device 300 or 302 is incident to the collimator lens 372. The polygon mirror 374 rotates at a constant velocity, and reflects the laser beam from the collimator lens 372 at a constant beam divergence angle. The fθ lens 376 receives the laser beam from the polygon mirror 374 and projects the reflection mirror 378. A latent image is formed on the photosensitive drum 380 by the reflected laser beam from the reflection mirror 378. The VCSEL of the embodiments may be used as a light source of an optical information processing device such as a copying machine or a printing machine having an optical system for focusing the laser beam from the VCSEL on the photosensitive drum, and a scanning system for scanning the laser beam on the photosensitive drum.

Figure 11:
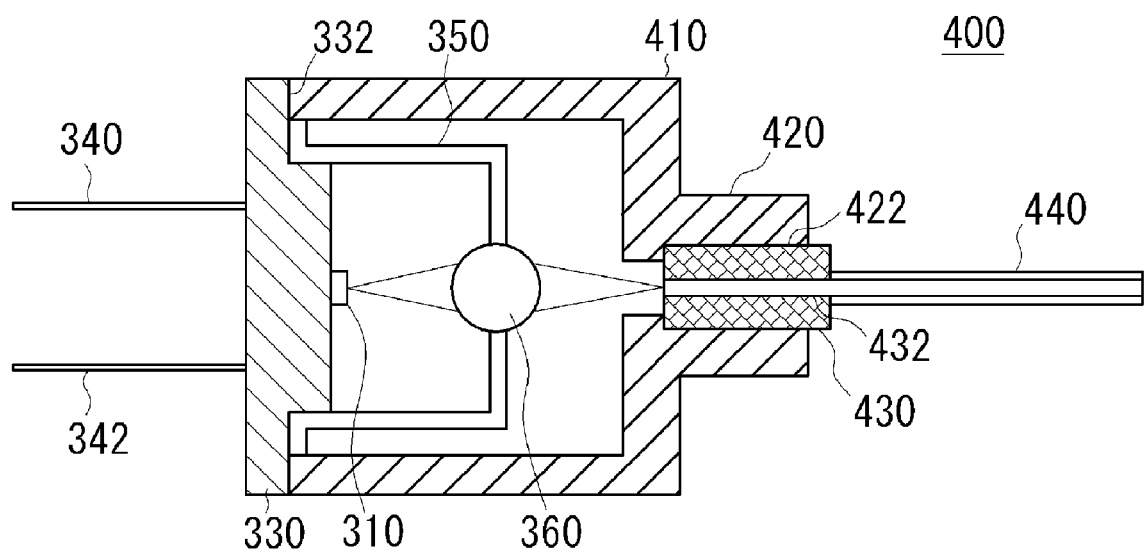
FIG. 11 is a cross-sectional view of an optical transmission device using the VCSEL illustrated in FIG. 9A.

FIG. 11 is a cross-sectional view an optical transmission device to which the surface emitting semiconductor laser illustrated in FIG. 9A is applied. An optical transmission device 400 includes a housing 410, a sleeve 420, a ferule 430, and an optical fiber 440. The housing 410 is formed into a hollow cylindrical shape and is fixed to the stem 330. The sleeve 420 is integrally formed to an end surface of the housing 410. The ferule 430 is held in an opening 422 of the sleeve 420. The optical fiber 440 is held by the ferule 430. An end of the housing 410 is fixed to a flange 332 formed in the circumferential direction of the stem 330. The ferule 430 is precisely positioned in the opening 422 of the sleeve 420, and the optical axis of the optical fiber 440 is aligned with the optical axis of the ball lens 360. A core line of the optical fiber 440 is held in a through hole 432 of the ferule 430.

The laser beam emitted from the surface of the chip 310 is collected by the ball lens 360, and is incident to the core line of the optical fiber 440. The ball lens 360 may be replaced with another lens such as a double-convex lens or a plane-convex lens. The optical transmission device 400 may include a driving circuit for applying the electric signal to the leads 340 and 342. The optical transmission device 400 may include a function of receiving the light signal via the optical fiber.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A surface emitting semiconductor laser comprising:
   a semiconductor substrate;
   a lower reflector that is formed on the semiconductor substrate and includes a semiconductor multilayer of a first conduction type;
   an upper reflector that is formed above the semiconductor substrate and includes a semiconductor multilayer of a second conduction type;
   an active region interposed between the lower reflector and the upper reflector;
   a current confining layer that is interposed between the lower reflector and the upper reflector and has a conductive region having an anisotropic shape in a plane perpendicular to an optical axis; and
   an electrode that is formed on the upper reflector and has an opening via which a laser beam is emitted,
   the opening having different edge shapes in directions of the anisotropic shape, the different edge shapes including a tapered edge shape in a major-axis direction of the anisotropic shape of the current confining layer and an edge shave in a minor-axis direction of the anisotropic shape of the current confining layer that is different than the edge shape in the major-axis direction.

2. The surface emitting semiconductor laser according to claim 1, wherein the different edge shapes include a vertical edge shape in a minor-axis direction.

3. The surface emitting semiconductor laser according to claim 1, further comprising a protection film that covers the opening in the electrode and is made of a transparent material.

4. The surface emitting semiconductor laser according to claim 3, wherein the protection film has different thicknesses in the directions of the anisotropic shape.

5. The surface emitting semiconductor laser according to claim 1, wherein:
   the surface emitting semiconductor laser has a post that has an elliptic shape and extends from the upper reflector to at least the current confining layer;
   the post has an oxidized region by selective oxidization from a side surface of the post; and
   the electrically conductive region is surrounded by the oxidized region.

6. A surface emitting semiconductor laser device comprising:
   a surface emitting semiconductor laser; and
   an optical component to which a laser beam from the surface emitting semiconductor laser is incident, the surface emitting semiconductor laser including:
   a semiconductor substrate;

a lower reflector that is formed on the semiconductor substrate and includes a semiconductor multilayer of a first conduction type;

an upper reflector that is formed above the semiconductor substrate and includes a semiconductor multi layer of a second conduction type;

an active region interposed between the lower reflector and the upper reflector;

a current confining layer that is interposed between the lower reflector and the upper reflector and has a conductive region having an anisotropic shape in a plane perpendicular to an optical axis; and an electrode that is formed on the upper reflector and has an opening via which the laser beam is emitted, the opening having different edge shapes in directions of the anisotropic shape, the different edge shapes including a tapered edge shape in a major-axis direction of the anisotropic shape of the current confining layer and an edge shape in a minor-axis direction of the anisotropic shape of the current confining layer that is different than the edge shape in the major-axis direction.

7. An optical transmission device comprising:

a surface emitting semiconductor laser; and a transmitter that transmits a laser beam from the surface emitting semiconductor laser to an optical medium, the surface emitting semiconductor laser including:

a semiconductor substrate;

a lower reflector that is formed on the semiconductor substrate and includes a semiconductor multilayer of a first conduction type;

an upper reflector that is formed above the semiconductor substrate and includes a semiconductor multilayer of a second conduction type;

an active region interposed between the lower reflector and the upper reflector;

a current confining layer that is interposed between the lower reflector and the upper reflector and has a conductive region having an anisotropic shape in a plane perpendicular to an optical axis; and an electrode that is formed on the upper reflector and has an opening via which the laser beam is emitted, the opening having different edge shapes in directions of the anisotropic shape, the different edge shapes including a tapered edge shape in a major-axis direction of the anisotropic shape of the current confining layer and an edge shape in a minor-axis direction of the anisotropic shape of the current confining layer that is different than the edge shape in the major-axis direction.

8. An optical information processing device comprising:

a surface emitting semiconductor laser;

a focusing part that focus a laser beam from the surface emitting semiconductor laser onto a recording medium; and a scanning part that scans the laser beam on the recording medium, the surface emitting semiconductor laser including:

a semiconductor substrate;

a lower reflector that is formed on the semiconductor substrate and includes a semiconductor multilayer of a first conduction type;

an upper reflector that is formed above the semiconductor substrate and includes a semiconductor multilayer of a second conduction type;

an active region interposed between the lower reflector and the upper reflector;

a current confining layer that is interposed between the lower reflector and the upper reflector and has a conductive region having an anisotropic shape in a plane perpendicular to an optical axis; and an electrode that is formed on the upper reflector and has an opening via which the laser beam is emitted, the opening having different edge shapes in directions of the anisotropic shape, the different edge shapes including a tapered edge shape in a major-axis direction of the anisotropic shape of the current confining layer and an edge shape in a minor-axis direction of the anisotropic shape of the current confining layer that is different than the edge shape in the major-axis direction.

\* \* \* \* \*